United States Patent [19]
Lee

[11] Patent Number: 5,631,652
[45] Date of Patent: May 20, 1997

[54] REMOTE CONTROL METHOD AND SYSTEM USING ONE REMOTE CONTROLLER TO CONTROL MORE THAN ONE APPARATUS

[75] Inventor: Sang-su Lee, Suwon, Rep. of Korea

[73] Assignee: Samsung Electronics Co., Ltd., Kyungki-do, Rep. of Korea

[21] Appl. No.: 433,641

[22] Filed: May 4, 1995

[30] Foreign Application Priority Data

May 10, 1994 [KR] Rep. of Korea ............. 94-10207

[51] Int. Cl.⁶ ................................................ H04B 3/00
[52] U.S. Cl. .............. 341/176; 340/870.24; 340/870.25
[58] Field of Search ................. 340/870.24, 870.25, 340/870.72; 341/176

[56] References Cited

U.S. PATENT DOCUMENTS

| | | | |
|---|---|---|---|
| 4,598,287 | 7/1986 | Osakabe | 340/825.72 |
| 4,855,730 | 8/1989 | Venners | 340/825.25 |
| 5,132,679 | 7/1992 | Kubo | 340/825.24 |
| 5,182,551 | 1/1993 | Goto | 340/825.24 |
| 5,255,180 | 10/1993 | Shinoda | 340/825.24 |
| 5,418,527 | 5/1995 | Yashiro | 340/825.72 |
| 5,420,573 | 5/1995 | Tanaka | 340/825.24 |
| 5,457,446 | 10/1995 | Yamamoto | 340/825.24 |
| 5,457,478 | 10/1995 | Frank | 340/825.72 |
| 5,473,317 | 12/1995 | Inomata | 340/825.25 |

*Primary Examiner*—Jeffery Hofsass
*Assistant Examiner*—Albert K. Wong
*Attorney, Agent, or Firm*—Sughrue, Mion, Zinn, Macpeak & Seas

[57] ABSTRACT

A remote control method and apparatus for controlling more than one apparatus using one remote control. The method includes the steps of: (a) storing a menu for controlling the plurality of AV apparatuses, the menu being categorized into a main menu level, a sub-menu level and a controlling menu level, and coding a signal corresponding to each of the menu levels; (b) displaying one of the menu levels stored in step (a) on a display device; (c) selecting one of the menu items from the level displayed in step (b); (d) transmitting the signal corresponding to the menu item selected in step (c) to a receiver of one of the AV apparatuses determined by recognizing the menu item selected in step (c) and generating the code of the corresponding menu item stored in step (a); and (e) executing the menu item selected in step (c) in response to the signal transmitted in step (d).

4 Claims, 4 Drawing Sheets

REMOTE CONTROL METHOD AND SYSTEM USING ONE REMOTE CONTROLLER TO CONTROL MORE THAN ONE APPARATUS

BACKGROUND OF THE INVENTION

The present invention relates to a remote control method and system therefor for use with a home appliance, and more particularly, to a remote control method and apparatus therefor, in which a plurality of appliances are controlled by one remote controller.

Generally, an apparatus to be controlled is equipped with a dedicated remote controller. For example, when viewing a video recording by connecting a video tape recorder with a television, two remote controllers, one for the video tape recorder and one for the television, are required. That is, when a user wants to control plural home appliances, two or more such remote controllers (a number corresponding to the number of apparatuses) are needed, which represents an inconvenience to the user.

SUMMARY OF THE INVENTION

It is an object of the present invention to provide a remote control method and apparatus therefor, in which a plurality of home appliances can be controlled by one remote controller.

To achieve the above object, the remote control method in which two or more AV apparatuses are controlled by one remote controller, comprises the steps of:

(a) storing a menu for controlling said plurality of AV apparatuses by stages after classifying a signal-controlling state of said plurality of AV apparatuses into a main menu stage, a sub menu stage and a regulating menu stage and coding a signal corresponding to each of said menu stages;

(b) displaying one of said menu stages stored in said step (a) on a predetermined display device;

(c) selecting one of said menu stages displayed in said step (b);

(d) transmitting the signal corresponding to the menu stage selected in said step (c) to a receiver of one of the plurality of AV apparatuses determined by recognizing the menu stage selected in said step (c) and generating the code of the corresponding menu stage stored in said step (a);

(e) executing the menu stage selected in said step (c) in response to the signal transmitted in said step (d).

Also, to achieve the above object, the remote control system in which two or more AV apparatuses are controlled by one remote controller, comprises:

a remote controller having: a menu selecting key for displaying a main menu representing each of said plurality of AV apparatuses, a sub menu belonging to the main menu and a regulating mode belonging to the sub menu, on a display device; cursor moving means for moving a cursor to select and adjust the main menu, the sub menu and the regulating mode displayed on the display device; an enter key for executing a menu in which the cursor is currently located; a plurality of keys including said menu selecting key and said enter key; and first transmitting means for transmitting signals corresponding to each of said plurality of keys and for transmitting signals corresponding to said cursor moving means;

a remote control repeater having: first receiving means for receiving a code signal transmitted from first transmitting means of said remote controller; displaying means for displaying the main menu corresponding to each of said plurality of AV apparatuses, the sub menu belonging to the main menu and the regulating mode belonging to the sub menu in response to a user touching the menu selecting key of said remote controller, and for displaying the cursor; memory means for storing a code signal after coding the code signal corresponding to each of the main menu, the sub menu, and the regulating mode; second transmitting means for transmitting the corresponding code of one of the main menu, the sub menu, and the regulating mode in which the cursor is located to a corresponding AV apparatus in accordance with a user touching the enter key of said remote controller; and control means for controlling operations of recognizing the signal received by said first receiver, displaying at least one of the menu, the sub menu, the regulating mode and the cursor, storing the code signal in the memory means, and transmitting the corresponding code signal via second transmitting means; and wherein each of said plurality of AV apparatuses has a second receiving means for receiving a signal transmitted from said remote control repeater.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
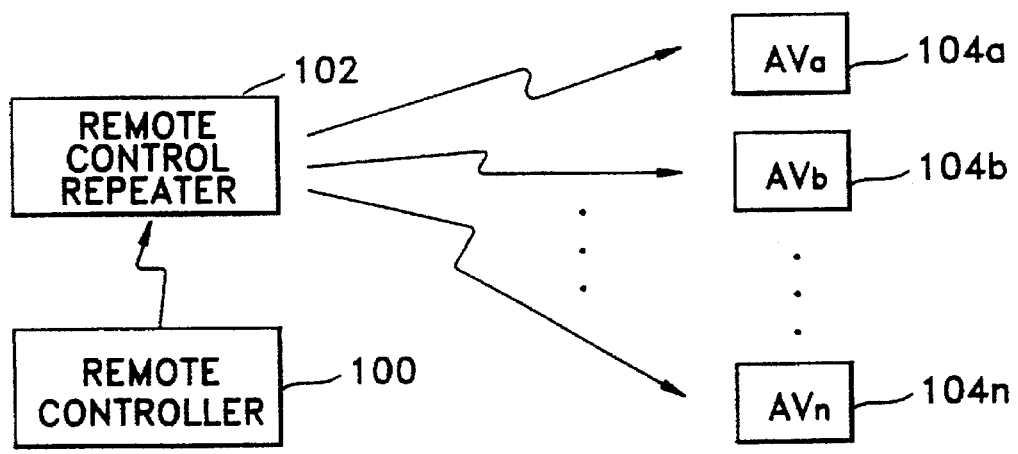
FIG. 1 is a schematic diagram for illustrating a remote control system according to a preferred embodiment of the present invention.

FIG. 1 is a schematic diagram for illustrating a remote control system according to a preferred embodiment of the present invention. In FIG. 1, reference numeral 100 represents a remote controller, 102 represents a remote control repeater and 104a to 104n represent AV apparatuses. A menu and a cursor are displayed in remote control repeater 102 and the cursor is moved to an intended menu by remote controller 100, and then the function of the menu selected by touching an enter key on remote controller 100 is executed. In FIG. 1, remote control repeater 102 includes a display device, signal transmitting and receiving means, a memory for storing the content of a predetermined menu, and a controller. Since the television comprises the display device for performing its original function, the television can operate as a good remote control repeater if the signal transmitting and receiving means, the memory and the controller of the remote control repeater are added thereto.

Next, the remote control method according to the present invention composed of the remote controller, the remote control repeater and a plurality of AV apparatuses, will be described.

Figure 2:
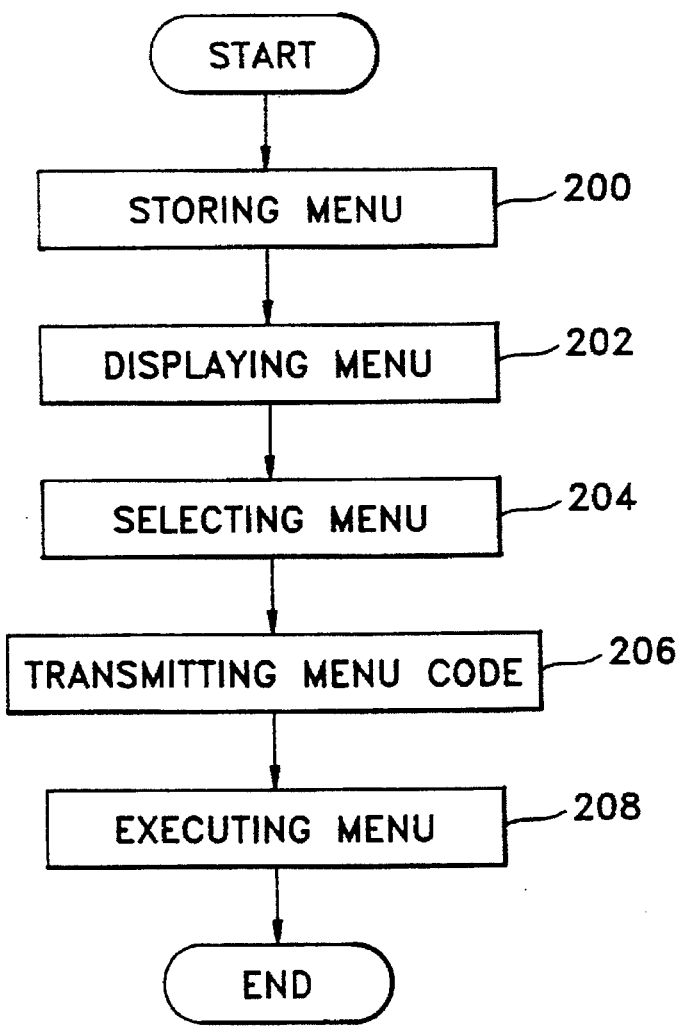
FIG. 2 is a flowchart for illustrating a remote control method according to the present invention shown in FIG. 1.

FIG. 2 is a diagram for illustrating a remote control method according to the present invention shown in FIG. 1. The remote control method comprises the steps of storing a menu (step 200), displaying the menu (step 202), of selecting a menu (step 204), transmitting the menu code (step 206) and executing the function of the menu (step 208).

In step 200, the signal-controlling stage of each AV apparatus is classified into a main menu stage, a sub menu stage and a regulating mode stage and the signal corresponding to each stage is coded and stored, so as to control by stages two or more AV apparatuses. In step 202, the menus corresponding to the functions of two or more AV apparatuses are displayed in a predetermined display device. In step 204, one of menus displayed in the step 202 is selected at the display device. In step 206, the menu selected in step 204, the code of menu stored in the step 200 is generated, and the generated code is transmitted to a predetermined receiver of each of the AV apparatuses. In step 208, the function of the menu is executed by receiving the signal transmitted in step 206.

Figure 3:
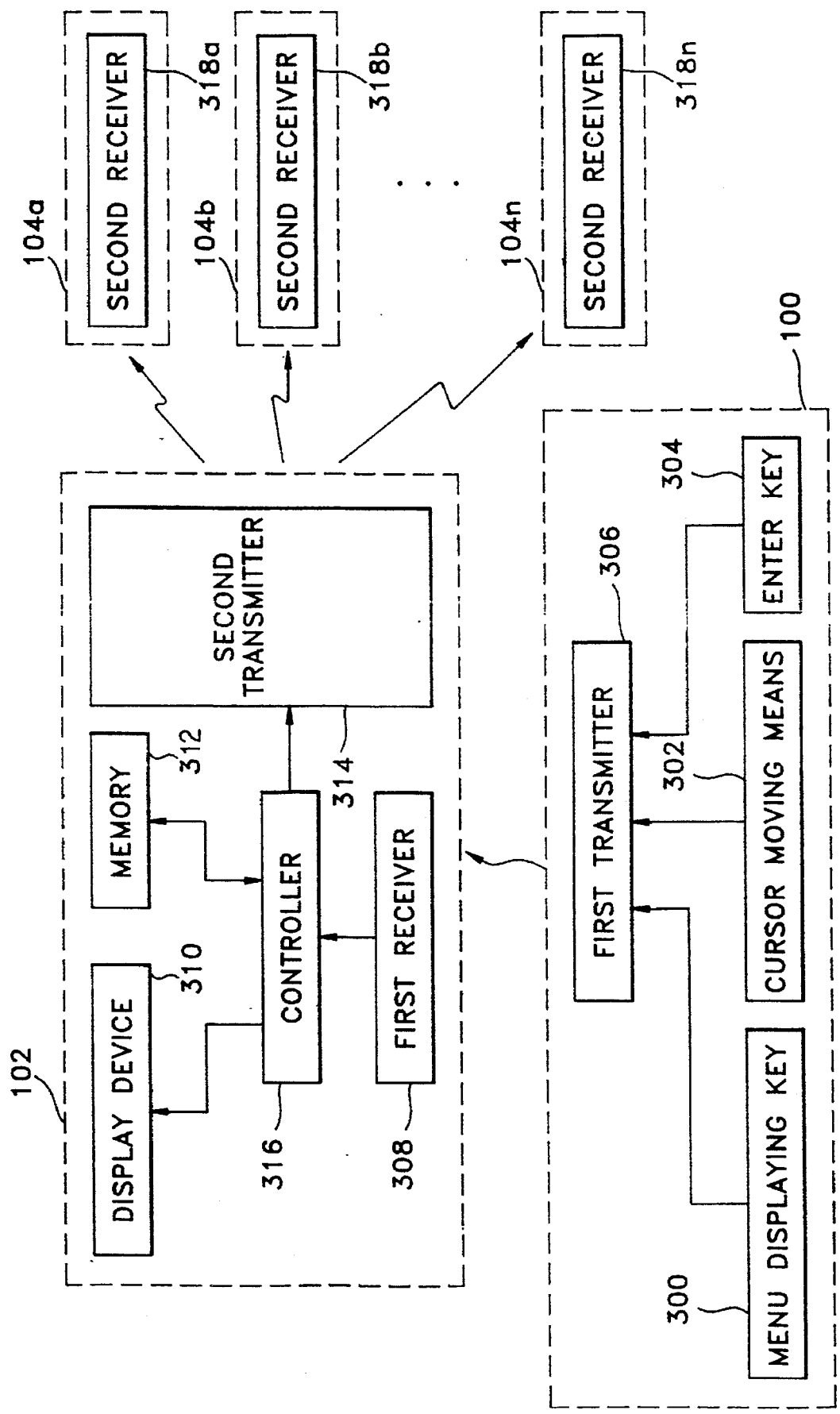
FIG. 3 is a detailed diagram for illustrating a remote control system according to a preferred embodiment of the present invention.

FIG. 3 is a detailed diagram for illustrating a remote control system according to a preferred embodiment of the present invention. As a feature of the present invention, there is remote control repeater 102 which communicates between the remote controller 100 and each of AV apparatuses 104a to 104n. Remote controller 100 has a menu displaying key 300 for displaying the icon corresponding to the menu, cursor moving means 302 for moving the cursor on the display device, an enter key 304 and a transmitter 306. Remote control repeater 102 has a first receiver 308 for receiving the signal transmitted by the first transmitter 306 of remote controller 100, a display device 310 for displaying the menus (the main menu, the sub menu and the regulating mode), a memory 312 for storing the code of said menus, a second transmitter 314 for transmitting the code signal of the selected menu to AV apparatuses, and a controller 316 for controlling each of the above elements of the control repeater. Each of AV apparatuses 104a to 104n are different from each other and has a second receiver 318a to 318n for recognizing the code each of the AV apparatuses being programmed to accomodate a different code.

When menu selecting key 300 of remote controller 100 is touched, the signal designated to menu displaying key 300 is transmitted by first transmitter 306. The signal transmitted by first transmitter 306 is received by first receiver 308 of remote control repeater 102. Controller 316 recognizes the signal received by first receiver 308 and commands display device 310 to display the menu.

Figure 4:
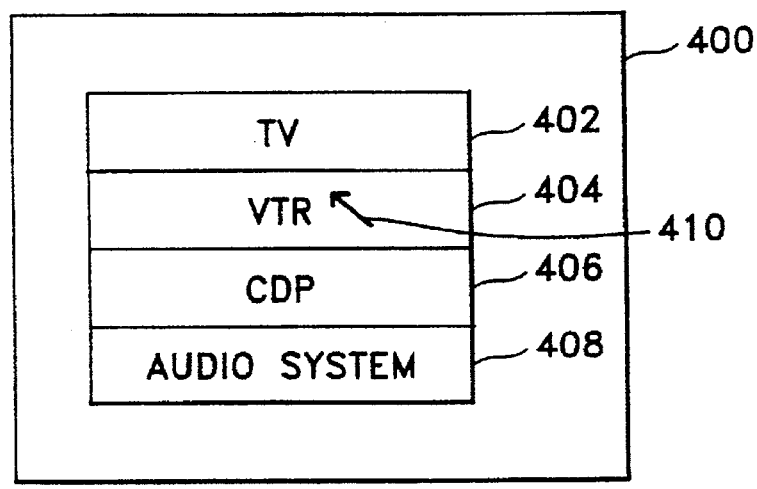
FIG. 4 is a diagram showing a state where a main menu is displayed in a display device.

FIG. 4 is a diagram showing a state where a main menu is displayed on a display device. In FIG. 4, reference numeral 400 represents a display device. FIG. 4 shows AV apparatuses set in the remote control repeater via a predetermined process. Reference numeral 402 represents the icon of a television (TV), 404 represent the icon of a video tape recorder (VTR), 406 represents the icon of a compact disk player (CDP), 408 represents the icon of an audio system, and 410 represents a cursor. Now, the cursor is placed in the icon of the menu 'VTR'. The position of the cursor can be changed by cursor moving means 302 of remote controller 100. The signal designated by cursor moving means 302 is transmitted via first transmitter 306. The transmitted signal is received by first receiver 308 and recognized by controller 316 so that the cursor is located in the corresponding position. The function of the menu in which the cursor is currently located is executed when enter key 304 is touched. That is, the signal designated by enter key 304 of remote controller 100 is transmitted by first transmitter 306 and the transmitted code signal is received by first receiver 308. The received signal is recognized by controller 316 and a signal is transmitted from memory 312 to each of AV apparatuses via second transmitter 314 designating the menu in which the cursor is currently located. The second receiver of each of AV apparatuses 104a to 104n receives the signal.

Figure 5:
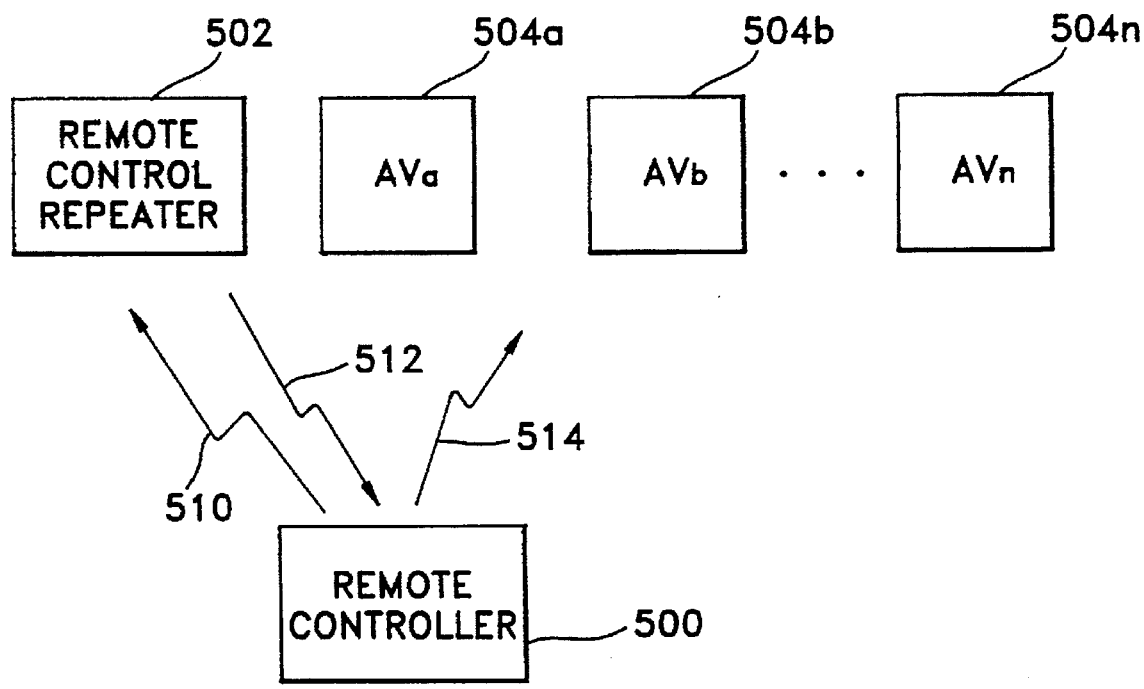
FIG. 5 is a schematic diagram for illustrating a remote control system according to another preferred embodiment of the present invention.

FIG. 5 is a schematic diagram for illustrating a remote control system according to another preferred embodiment of the present invention. In FIG. 5, reference numeral 500 represents a remote controller, 502 represents a remote control repeater and 504a to 504n represent a plurality of AV apparatuses. Numeral 510 represents a signal transmitted from remote controller 500 to remote control repeater, and 512 represents a signal transmitted from remote control repeater 502 to remote controller 500 after a predetermined process is performed. Numeral 514 represents the signal transmitted from remote controller 500 to each of AV apparatuses 504a to 504n.

The operation of remote controller 500, remote control repeater 502 and AV apparatuses 504a to 504n of FIG. 5 will be described as another embodiment of the present invention.

First, differently from remote controller 100 of FIG. 1, remote controller 500 of FIG. 5 receives the signal transmitted from remote control repeater 502, converts the signal to a signal which is free from the intervention of the signal which is transmitted from remote control repeater 502 in the initial state, and transmits the converted signal to the receiver of AV apparatuses 504a to 504n. That is, remote controller 500 of FIG. 5 is constructed by adding a predetermined receiver and signal converter to remote controller 100 of FIG. 1.

Figure 6:
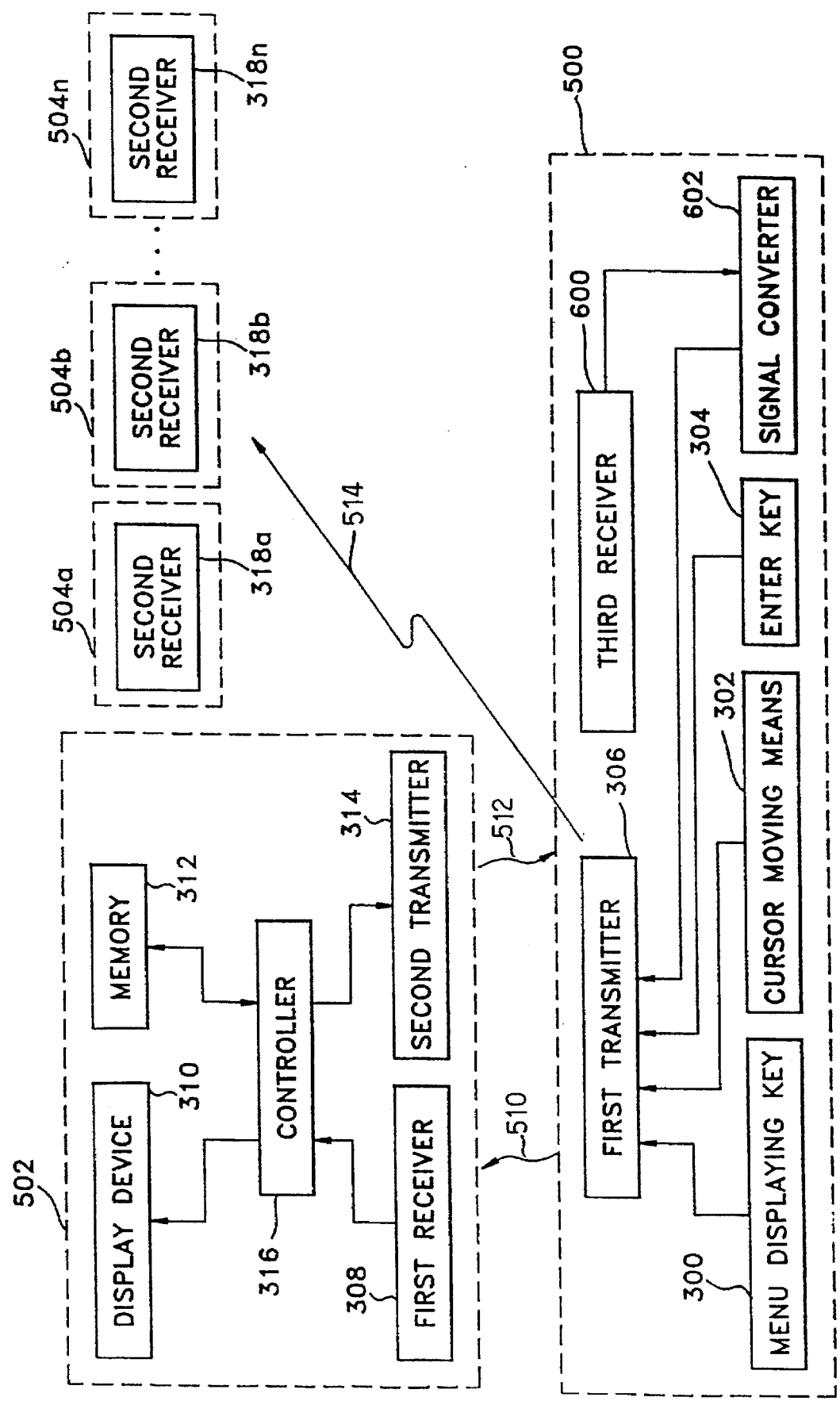
FIG. 6 is a detailed diagram for illustrating the remote control system shown in FIG. 5.

FIG. 6 is a detailed diagram for illustrating the remote control system shown in FIG. 5. In FIG. 6, reference numerals 500, 502 and 504a to 504n represent remote controller, remote control repeater and a plurality of AV apparatuses of FIG. 5, respectively. The description of menu displaying key 300, cursor moving means 302, enter key 304 and first transmitter 306 of remote controller 500 will be omitted since they perform the same functions as those of FIG. 3. Reference numeral 600 represents a third receiver for receiving the signal transmitted from second transmitter 314, and 602 represents a signal converter for converting the code of the signal received by third receiver 600 as the code which is free from intervention of the signal which is transmitted from second transmitter 314. The description of remote control repeater 502 will be omitted since it is the same as that of FIG. 3. Each of AV apparatuses 504a to 504n has a second receiver 318a to 318n which is the same as that of FIG. 3. A second receiver of each of AV apparatuses recognizes the signal which is converted by signal converter 602 of remote controller 500 and transmitted via first transmitter 306.

A code signal which is intended to be executed is transmitted to first receiver 308 of remote control repeater 502 via first transmitter 306 by menu displaying key 300, cursor moving means 302 and enter key 304 of remote controller 500. The signal transmitted from second transmitter 314 of remote control repeater 502 is received by third receiver 600 of remote controller 500 and the received signal is converted by signal converter 602. If the signal of second transmitter 314 is transmitted to first transmitter 306 via third receiver 600 without conversion, a problem occurs in second receiver 318a to 318n of AV apparatuses. That is, in the case of a toggle key such as a switch by which the power is alternatedly turned on and turned off, the state of second receiver 318a to 318n of AV apparatuses is toggled from "ON" to "OFF" by the signal transmitted from second transmitter 314 of remote control repeater 502, and thereafter, the "OFF" state is restored to the "ON" state by the same signal transmitted from first transmitter 306 via third receiver 600 of remote controller 500. This causes a user to be confused in operating the remote control. The signal received by the third receiver of remote controller 500 should be converted in order to prevent this kind of confusion.

As described above, the remote control method and apparatus therefor can control a plurality of AV apparatuses with one remote controller.

What is claimed is:

1. A method which enables a plurality of AV apparatuses to be remotely controlled using only one remote controller, the method comprising the steps of:

(a) storing a menu for controlling said plurality of AV apparatuses, said menu being categorized into a main menu level, a sub menu level and a regulating menu level, and coding a signal corresponding to each of said menu levels;

(b) displaying said main menu level on a predetermined display device;

(c) selecting a first menu entry from said main menu level displayed in said step (b);

(d) displaying the sub menu associated with the main menu entry selected in step (c);

(e) selecting a second menu entry from said sub menu displayed in step (d);

(f) displaying the regulating menu associated with the second menu entry selected in step (e);

(g) selecting a third menu entry from said regulating menu displayed in step (f);

(h) transmitting a signal corresponding to the third menu entry selected in said step (g) to a receiver of said one of the plurality of AV apparatuses determined by recognizing the third menu entry selected in said step (g) and generating the code of the corresponding menu entry stored in said step (a); and (i) executing a function corresponding to the menu entry selected in said step (g) in response to the signal transmitted in said step (h).

2. A remote control system for remote-controlling a plurality of AV apparatuses with one remote controller, the remote control system comprising:

a remote controller having: a menu selecting key for displaying a menu on a display device, said menu being categorized into a main menu representing each of said plurality of AV apparatuses, a sub menu of the main menu and a regulating menu of the sub menu; cursor moving means for moving a cursor to select and adjust the main menu, the sub menu and the regulating menu displayed on the display device; an enter key for executing a menu in which the cursor is currently located; a plurality of keys including said menu selecting key and said enter key; and first transmitting means for transmitting signals corresponding to each of said plurality of keys and for transmitting signals corresponding to said cursor moving means;

a remote control repeater having: first receiving means for receiving one of the signals corresponding to each of said plurality of keys and the signals corresponding to said cursor moving means transmitted from first transmitting means of said remote controller; displaying means for displaying the main menu corresponding to each of said plurality of AV apparatuses, the sub menu of the main menu and the regulating menu of the sub menu in response to a user touching the menu selecting key of said remote controller, and for displaying the cursor; memory means for storing a plurality of code signals after coding each of said plurality of code signals to respectively correspond to each of the main menu, the sub menu, and the regulating menu; second transmitting means for transmitting the corresponding code signal of one of the main menu, the sub menu, and the regulating menu in which the cursor is located to a corresponding AV apparatus in accordance with a user touching the enter key of said remote controller; and control means for controlling operations of recognizing said one of the signals corresponding to each of said plurality of keys and the signals corresponding to said cursor moving means received by said first receiver, displaying at least one of the main menu, the sub menu, the regulating menu and the cursor in response to the recognizing, storing the plurality of code signals in the memory means, and transmitting the corresponding code signal via second transmitting means; and wherein each of said plurality of AV apparatuses has a second receiving means for receiving the corresponding code signal transmitted from said remote control repeater.

3. A remote control system for remote-controlling a plurality of AV apparatuses with one remote controller, the remote control system comprising:

a remote controller comprising:
  a) a menu selecting key for causing a menu to be displayed, said menu being categorized into a main menu representing each of said plurality of AV apparatuses, a sub menu of the main menu and a regulating menu of the sub menu;
  b) cursor moving means for moving a cursor to select an entry from the displayed main menu, the displayed sub menu and the displayed regulating menu;
  c) an enter key for executing a menu in which the cursor is currently located;
  d) a plurality of additional keys including said menu selecting key and said enter key; and
  e) first transmitting means for transmitting signals corresponding to each of said plurality of keys and for transmitting signals corresponding to said cursor moving means;

a remote control repeater comprising:
  a) first receiving means for receiving the signal transmitted from first transmitting means of said remote controller;
  b) displaying means for displaying the main menu corresponding to each of said plurality of AV apparatuses, the sub menu of the main menu and the regulating menu of the sub menu in response to a user touching the menu selecting key of said remote controller, and for displaying the cursor;
  c) memory means for storing a code signal after coding the code signal corresponding to each of the main menu, the sub menu, and the regulating menu;

d) second transmitting means for transmitting the corresponding code of one of the main menu, the sub menu, and the regulating menu in which the cursor is located;

e) control means for controlling operations of recognizing the signal received by said first receiver, displaying at least one of the menu, the sub menu, the regulating menu and the cursor, storing the code signal in the memory means, and transmitting the corresponding code signal via second transmitting means;

wherein said remote control system further comprises:

third receiving means for receiving the corresponding code transmitted from said second transmitting means of the remote control repeater; and signal converting means for converting the corresponding code received by said third receiving means and supplying the converted signal to said first transmitting means which transmits said converted signal to a corresponding AV apparatus.

4. A remote control system as claimed in claim 3, wherein said signal converting means converts the signal received by said third receiving means to a signal which is substantially free from interference by the signal transmitted from said second transmitting means of said remote control repeater.

* * * * *